US007009895B2

(12) United States Patent
Bunce et al.

(10) Patent No.: US 7,009,895 B2
(45) Date of Patent: Mar. 7, 2006

(54) METHOD FOR SKIP OVER REDUNDANCY DECODE WITH VERY LOW OVERHEAD

(75) Inventors: Paul A. Bunce, Poughkeepsie, NY (US); John D. Davis, Wallkill, NY (US); Thomas J. Knips, Wappingers Falls, NY (US); Donald W. Plass, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 10/814,719

(22) Filed: Mar. 31, 2004

(65) Prior Publication Data

US 2005/0226063 A1   Oct. 13, 2005

(51) Int. Cl.
  *G11C 29/00*  (2006.01)
  *G11C 7/00*   (2006.01)

(52) U.S. Cl. ............ 365/200; 365/230.02; 365/230.04; 365/230.06

(58) Field of Classification Search ............... 365/200, 365/230.02, 230.04, 230.06
See application file for complete search history.

(56) References Cited

U.S. PATENT DOCUMENTS 6,373,775 B1 * 4/2002 Ishikawa ............... 365/230.03
6,584,023 B1   6/2003 Bunce et al. ............... 365/200

\* cited by examiner

*Primary Examiner*—VanThu Nguyen
(74) *Attorney, Agent, or Firm*—Lynn L. Augspurger

(57) ABSTRACT

The method described uses a Skip-Over technique which requires a set of muxes at the input and output of a block that is to be repaired. The improved method of implementing I/O redundancy control logic has a minimal impact to both chip area and chip wire tracks. To overcome problems of required real estate usage on a chip that was undesirable enables use of odd and even decoder outputs that can share a single wire track, the same wire being utilizable for both odd and even decoder outputs. In order to implement the decode and carry function as a centralized function, there arises a requirement that logically adjacent decode circuits (decoders connected by a carry signal) should be physically close together to minimize the overhead of the carry wiring. If the decode structure and the mux structure are arranged orthogonal to each other, then each decoder output would require a wire track. The described method however, allows odd and even decoder outputs to share the same wire track. This reduces the number of wire tracks from 1 track per I/O to 1 track per 2 I/Os.

10 Claims, 5 Drawing Sheets

METHOD FOR SKIP OVER REDUNDANCY DECODE WITH VERY LOW OVERHEAD

FIELD OF THE INVENTION

This invention relates to standalone memory products such as SRAM, and DRAM and embedded memory applications such as Microprocessors, and particularly to a method of implementing I/O redundancy control logic with a minimal impact to both chip area and chip wire tracks.

DESCRIPTION OF BACKGROUND

Redundancy is a technique that is used to replace a defective element of a chip with a spare element. At least two types of redundancy are used in RAM design. Wordlines have been traditionally repaired by a "real-time" compare of an address and a known defective address. If the address matches the known defective address, the main array is bypassed and a spared wordline is activated. Skip-Over Redundancy has been used to repair defective I/O circuits and bit columns. See the patent entitled "A SYSTEM FOR IMPLEMENTING A COLUMN REDUNDANCY SCHEME FOR ARRAYS WITH CONTROLS THAT SPAN MULTIPLE DATA BITS", of Paul Bunce, John Davis, Thomas Knips, and Donald Plass, U.S. Pat. No. 6,584,023, issued Jun. 24, 2003 (which is incorporated herein by reference) which describes as an exemplary embodiment a system for implementing a column redundance scheme for arrays with controls that span multiple data bits. The system includes an array of data bits for receiving data inputs, a spare data bit and a field control input line. Also included in the system is circuitry to separate a field control signal from the field control input line into one or more individual control signals for activating a corresponding data bit in the array or for input to a multiplexor. The system further comprises circuitry to steer around a defective data bit in the array. This circuitry includes: a field control signal multiplexor corresponding to each field control signal; a spare control signal multiplexor to activate the spare data bit; a data multiplexor corresponding to each of the data bits in the array; and a spare data multiplexor to steer one of the data inputs

SUMMARY OF THE INVENTION

The invention described below is a method of implementing I/O redundancy control logic with a minimal impact to both chip area and chip wire tracks. While our prior solution described in the referenced U.S. Pat. No. 6,584,023 we could implement the decode and carry function as a centralized function. However, the solution required real estate usage on a chip that was undesirable. Our solution to this problem enables use of odd and even decoder outputs that can share a single wire track, the same wire being utilizable for both odd and even decoder outputs. Using the method described below, the odd and even decoder outputs can share the same wire track. This reduces the number of wire tracks from 1 track per I/O to 1 track per 2 I/Os. Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 5:
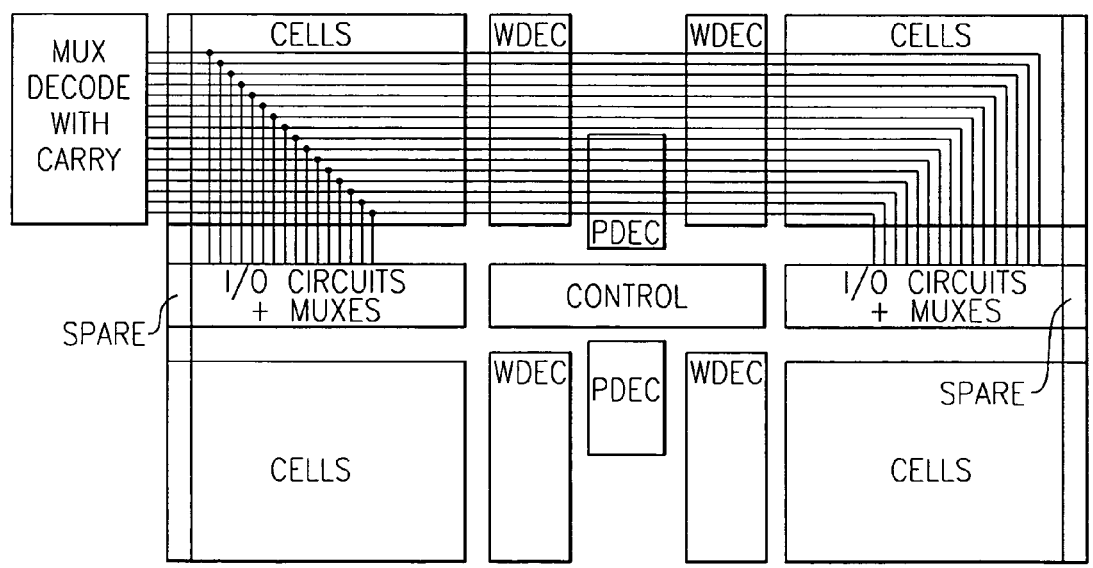
FIG. 5 illustrates one example of a physical implementation that requires one vertical wire per block.
Figure 6:
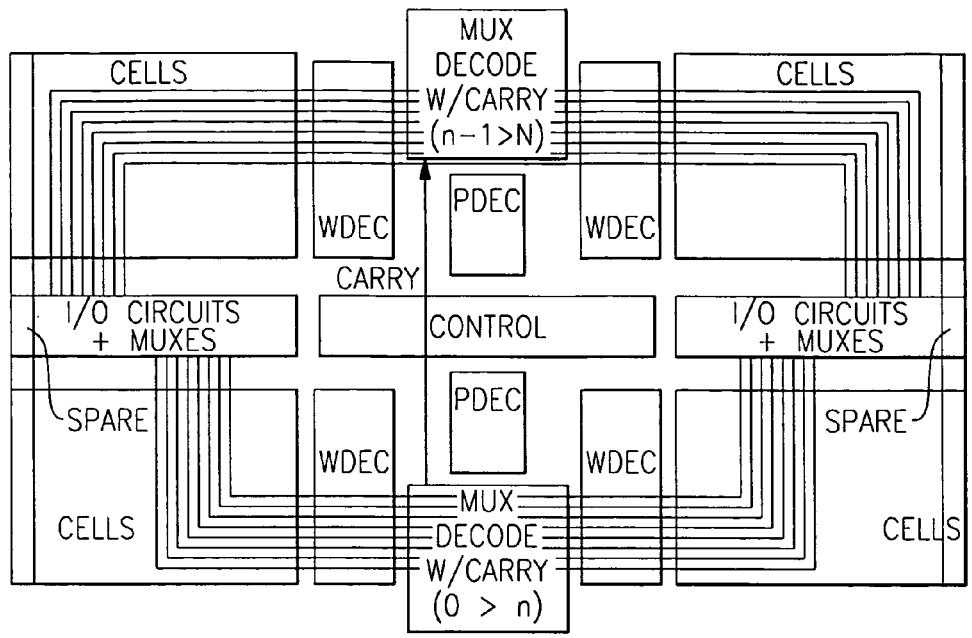
FIG. 6 illustrates one example of a physical implementation that fits in macro white space.

Turning now to our invention, our method uses a Skip-Over technique which requires a set of muxes at the input and output of a block that is to be repaired. Our improved method of implementing I/O redundancy control logic has a minimal impact to both chip area and chip wire tracks. Our solution to overcome problems of required real estate usage on a chip that was undesirable enables use of odd and even decoder outputs that can share a single wire track, the same wire being utilizable for both odd and even decoder outputs. In order to implement the decode and carry function as a centralized function, there arises a requirement that logically adjacent decode circuits (decoders connected by a carry signal) should be physically close together to minimize the overhead of the carry wiring. If the decode structure and the mux structure are arranged orthogonal to each other, then each decoder output would require a wire track. (as shown in FIGS. 5 and 6). Using the method described below, the odd and even decoder outputs can share the same wire track. This reduces the number of wire tracks from 1 track per I/O to 1 track per 2 I/Os.

Figure 1:
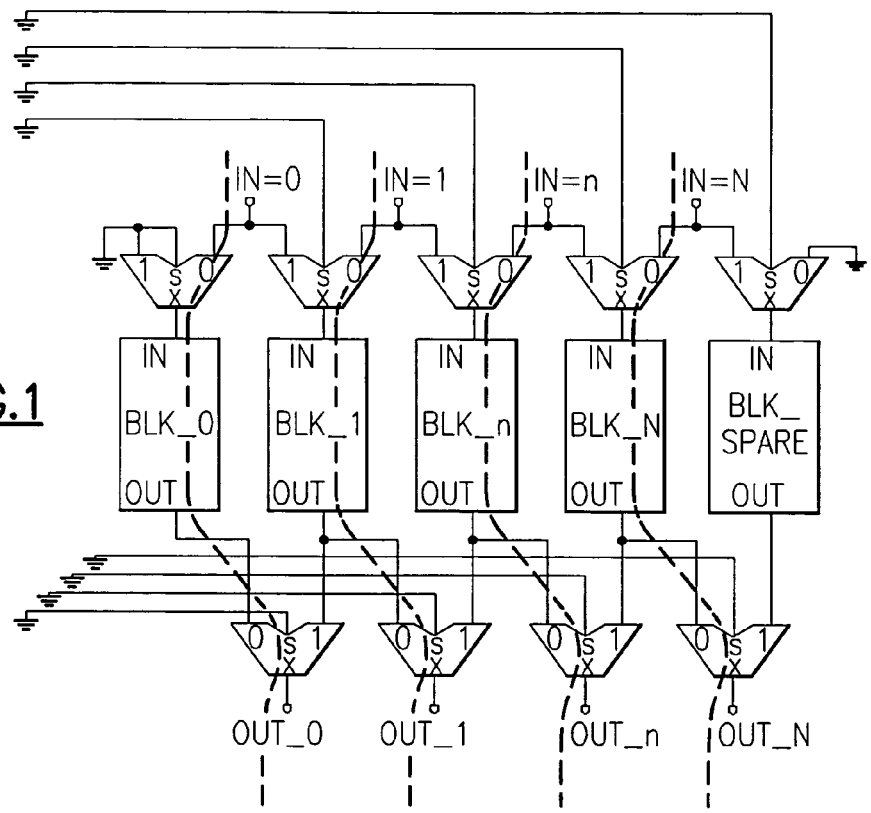
FIG. 1 illustrates one example of Skip Over Redundancy with no blocks skipped over.
Figure 2:
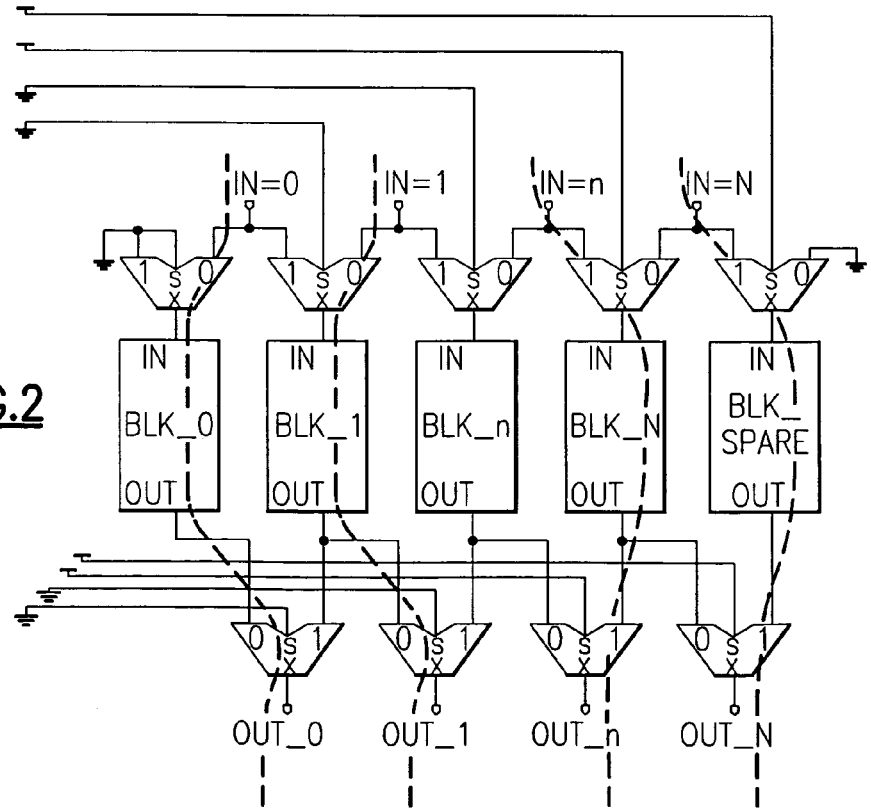
FIG. 2 illustrates one example of Skip Over Redundancy with block n skipped over.

FIG. 1 and FIG. 2 demonstrate the Skip-Over technique. In FIG. 1 all the shift lines are low, indicating that no repair is required. In this case the redundant element is not used and the data flow from input to output follows the path traced by the dotted line. In FIG. 2 all the shift lines above block n are all high indicating that block n is to be repaired or "skipped-over". The dotted lines show the path from input to output. Note that this time block n is "skipped-over" and spare element is used.

Figure 3:
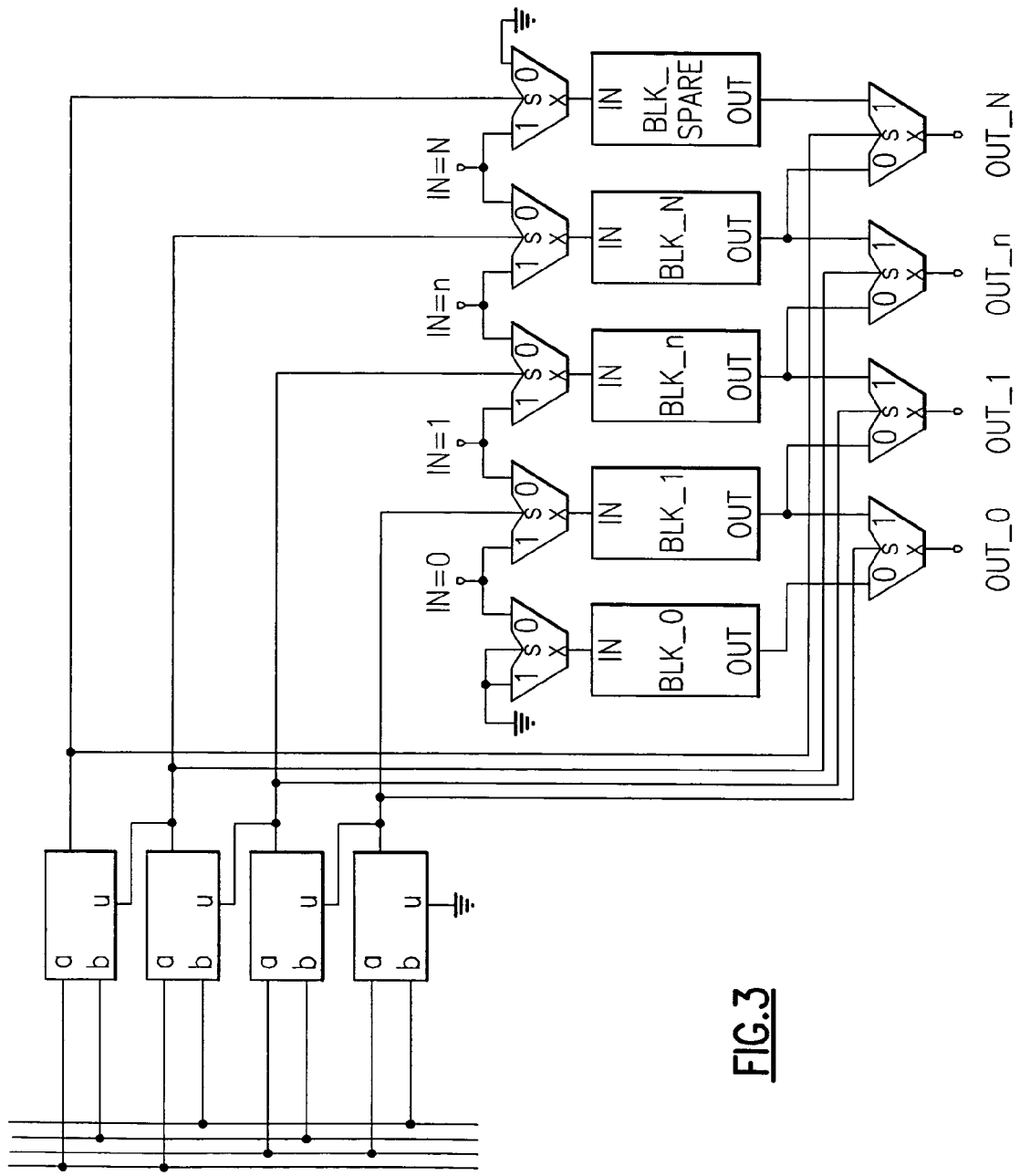
FIG. 3 illustrates one example of Skip Over Redundancy using decode and carry.

The shift control signals to these muxes can be generated by a decode and carry structure. FIG. 3 shows a Skip-Over implementation of I/O redundancy using a decode and carry structure to control the mux select signals. In this example the decoder inputs are programmed to select the mux to the right of the block that needs to be skipped over, the carry feature forces a select on all the mux select signals to the right of the programmed mux. The inputs to the decoder are typically "configured" before the data path begins normal operation. This means that the outputs of the decode and carry structure are not time critical.

Figure 4:
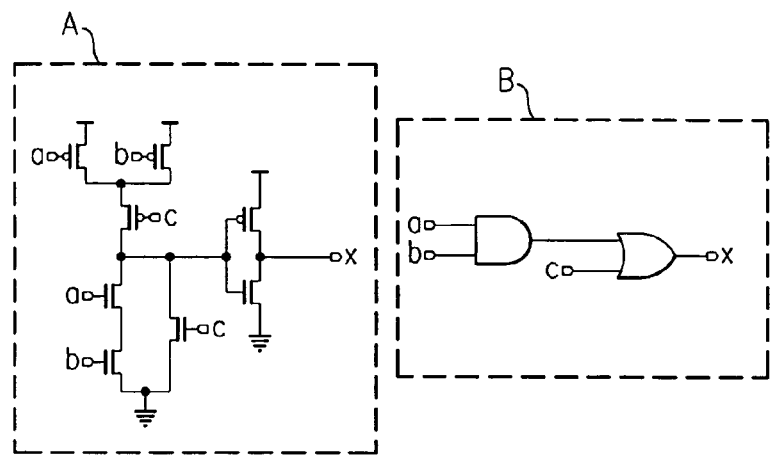
FIG. 4 illustrates one example of a logical and transistor level implementation of decode and carry.

FIG. 4 is an implementation of the decode and carry circuit used in FIG. 3. The logic function is an "and-or". The transistor level implementation is a natural choice for this logic function because it implements the function using a minimal number of transistors.

FIG. 5 shows an example of a RAM floorplan that uses the skip over technique to implement I/O redundancy. In this example, there are two sets of I/O circuits, one in the right half macro and one in the left half macro. Each half has a set of I/O circuits and a "spare". The decode and carry structure is shared by both sets of I/O circuits. In this example the decode and carry structure is placed ot the side of the RAM and the decode wires flow horizontally across the memory cells and then vertically down to the I/O circuits and muxes. There are two disadvantages with this implementation. First, the decode and carry occupies additional space outside the RAM. Secondly the implementation requires one vertical wire for each I/O.

FIG. 6 is an enhancement to the implementation. In this case, the decode and carry function is broken up into two groups; each group provides the mux controls for half of the I/O circuits. This allows the function to fit into "whitespace" in upper and lower half of the RAM, saving space. The number of vertical wires increases by one (the carry signal from the lower half to the upper half). The number of vertical wires driving to the muxes remains the same. Half the wires come from the bottom and half the wires come from the top.

Figure 7:
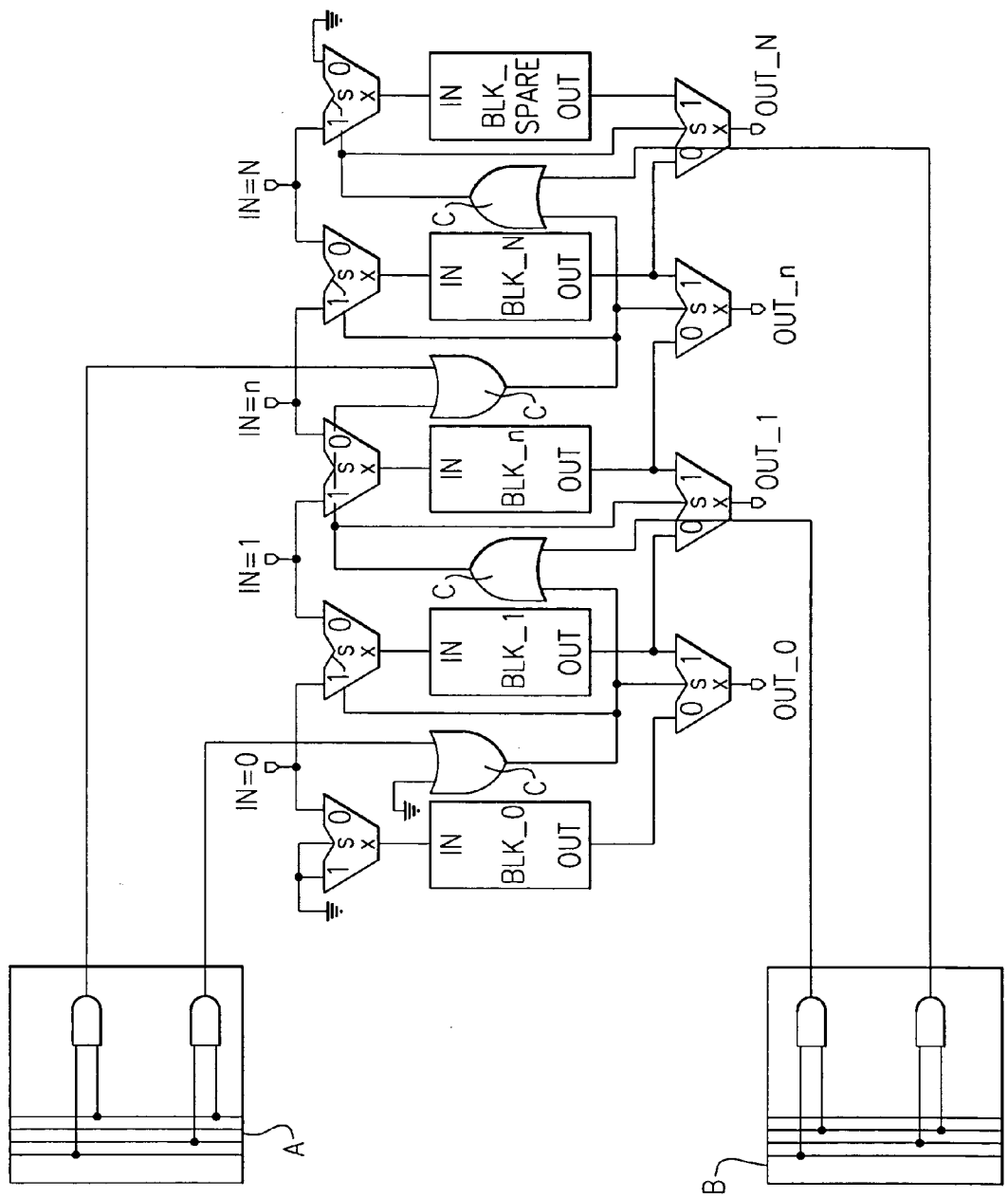
FIG. 7 illustrates one example of the odd/even decode scheme with the decode function separate from the carry function.

FIG. 7 is an implementation of skip-over redundancy using the decode and carry function. In this case, however, instead of using the centralized decode and carry circuit shown in the left side of FIG. 4, the circuit is repartitioned. In this case the AND portion of the decode has been separated from the OR (carry) portion of the circuit. In this implementation the OR function is physically located with the mux and I/O circuit, permitting the "odd" and "even" numbered decoders to be physically disjoint. In this example, the "even" decoders drive to the I/O circuits from above while the "odd" decoders drive from the bottom. Since the "odd" and "even" decoders are driving to the I/O circuits from different directions, and the I/O circuits they drive are physically adjacent it is possible to share the wire tracks (in this case the vertical tracks) between the "odd" and "even" decode wires.

Figure 8:
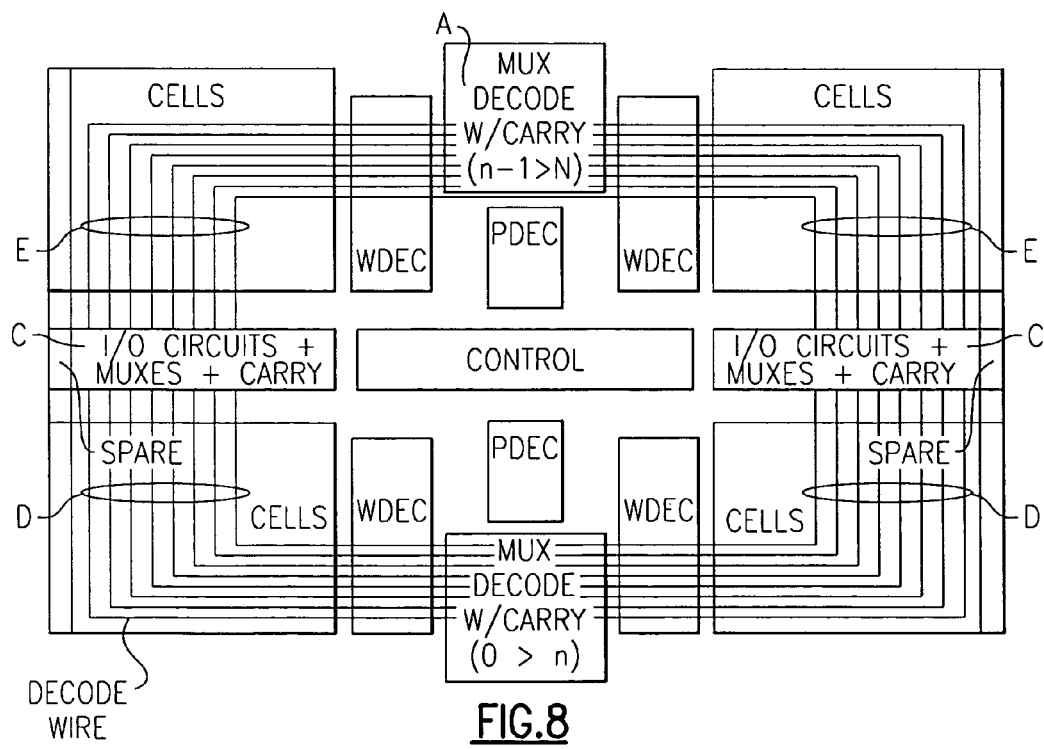
FIG. 8 illustrates one example of a physical implementation of odd/even decode scheme with the decode function fitting into macro white space and requiring only one wire track per block.

FIG. 8 demonstrates a floorplan that implements this methodology. Separating the decode and carry logic, and partitioning the decode into "odd" and "even" groups allows the decode function to be broken up two or more blocks which are more easily placed into existing "whitespace". Furthermore, the number of wire tracks required to implement the function is reduced by half.

The examples shown in this specification assume two sets of I/O circuits each with one repair each. In practice this methodology would apply to a wide range of RAM configurations, each with a wide range of repair actions.

While the preferred embodiment to the invention has been described, it will be understood that those skilled in the art, both now and in the future, may make various improvements and enhancements which fall within the scope of the claims which follow. These claims should be construed to maintain the proper protection fo the invention first described.

What is claimed is:

1. A method for implementing skip over redundancy decode on a chip, comprising the steps of:
    implementing a decode circuit for redundant decode on a chip by providing for said decode circuit a decoder and a separate carry function for said decode circuit.

2. The method according to claim 1, wherein the separate carry function is implemented separately from the decoder and implemented with carry logic.

3. The method according to claim 2 wherein said decoder of said decoder circuit is partitioned into even decode and odd decode logic components.

4. The method according to claim 3 wherein the even decode and odd decode logic components have an output wire track and the physical partitioning and arrangement of said even decode and odd decode logic components and their outputs share a common wire track.

5. The method according to claim 3 wherein the even decode and odd decode logic components have an output wire track and the physical partitioning and arrangement of said even decode and odd decode logic components and their outputs share a common wire track approaching said carry logic from opposition directions.

6. The method according to claim 3 wherein the physical partitioning and arrangement of said even decode and odd decode logic and the associated carry logic performing the carry function for said decode circuit are placed laid out in placement into unused "whitespace" within a chip macro, and thus by said placement save chip area.

7. The method according to claim 6 wherein the even decode and odd decode logic components have an output wire track and the physical partitioning and arrangement of said even decode and odd decode logic components and their outputs share a common wire track approaching said carry logic from opposite directions.

8. The method according to claim 5 wherein said common wiring track decreases the wiring tracks (required to implement the decoder circuit).

9. The method according to claim 8 wherein said sharing of a common wiring track increases the wiring tracks (resources) available to a next level of chip assembly.

10. The method according to claim 9 wherein said decode circuit is used to implement I/O redundancy control logic and provides one wire trace for two I/Os.

* * * * *